(12) United States Patent  
Ouyang et al.

(10) Patent No.: US 7,342,294 B2
(45) Date of Patent: Mar. 11, 2008

(54) SOI BIPOLAR TRANSISTORS WITH REDUCED SELF HEATING

(75) Inventors: Qiqing Ouyang, Yorktown Heights, NY (US); Kai Xiu, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/173,540

(22) Filed: Jul. 1, 2005

(65) Prior Publication Data

US 2007/0001262 A1    Jan. 4, 2007

(51) Int. Cl.
H01L 27/082 (2006.01)
H01L 27/102 (2006.01)
H01L 29/70 (2006.01)
H01L 31/11 (2006.01)

(52) U.S. Cl. .............. 257/577; 257/587; 257/E21.608; 257/E27.053

(58) Field of Classification Search .......... 257/577, 257/587, E21.608, E27.053
See application file for complete search history.

(56) References Cited

U.S. PATENT DOCUMENTS

| | | | |
|---|---|---|---|
| 6,376,867 B1 * | 4/2002 | Gutierrez-Aitken et al. | 257/197 |
| 6,633,075 B1 * | 10/2003 | Shirakawa | 257/565 |
| 7,019,395 B2 * | 3/2006 | Hirano et al. | 257/717 |
| 2003/0122232 A1 * | 7/2003 | Hirano et al. | 257/678 |
| 2003/0197193 A1 * | 10/2003 | Pierson et al. | 257/197 |
| 2005/0073043 A1 * | 4/2005 | Teshima | 257/718 |
| 2005/0077599 A1 * | 4/2005 | Miura et al. | 257/669 |
| 2006/0055056 A1 * | 3/2006 | Miura et al. | 257/779 |
| 2006/0108665 A1 * | 5/2006 | Kurokawa et al. | 257/592 |
| 2006/0244012 A1 * | 11/2006 | Wang | 257/197 |

* cited by examiner

Primary Examiner—Ngân V. Ngô
(74) Attorney, Agent, or Firm—Michael J. Buchenhorner; Ido Tuchman

(57) ABSTRACT

A bipolar transistor includes a collector located over a substrate; and a heat conductive path connecting the substrate to the collector. The heat conductive path is filled with a heat conductive material such as metal or polysilicon. In one embodiment the heat conductive path runs through the collector to extract heat from the collector and drain it to the substrate. In alternate embodiments, the transistor can be a vertical or a lateral device. According to another embodiment, an integrated circuit using BiCMOS technology comprises pnp and npn bipolar transistors with heat conduction from collector to substrate and possibly p-channel and n-channel MOSFETS. According to yet another embodiment, a method for making a transistor in an integrated network comprises steps of etching the heat conducting path through the collector and to the substrate and fill with heat conductive material to provide a heat drain for the transistor comprising the collector.

17 Claims, 5 Drawing Sheets

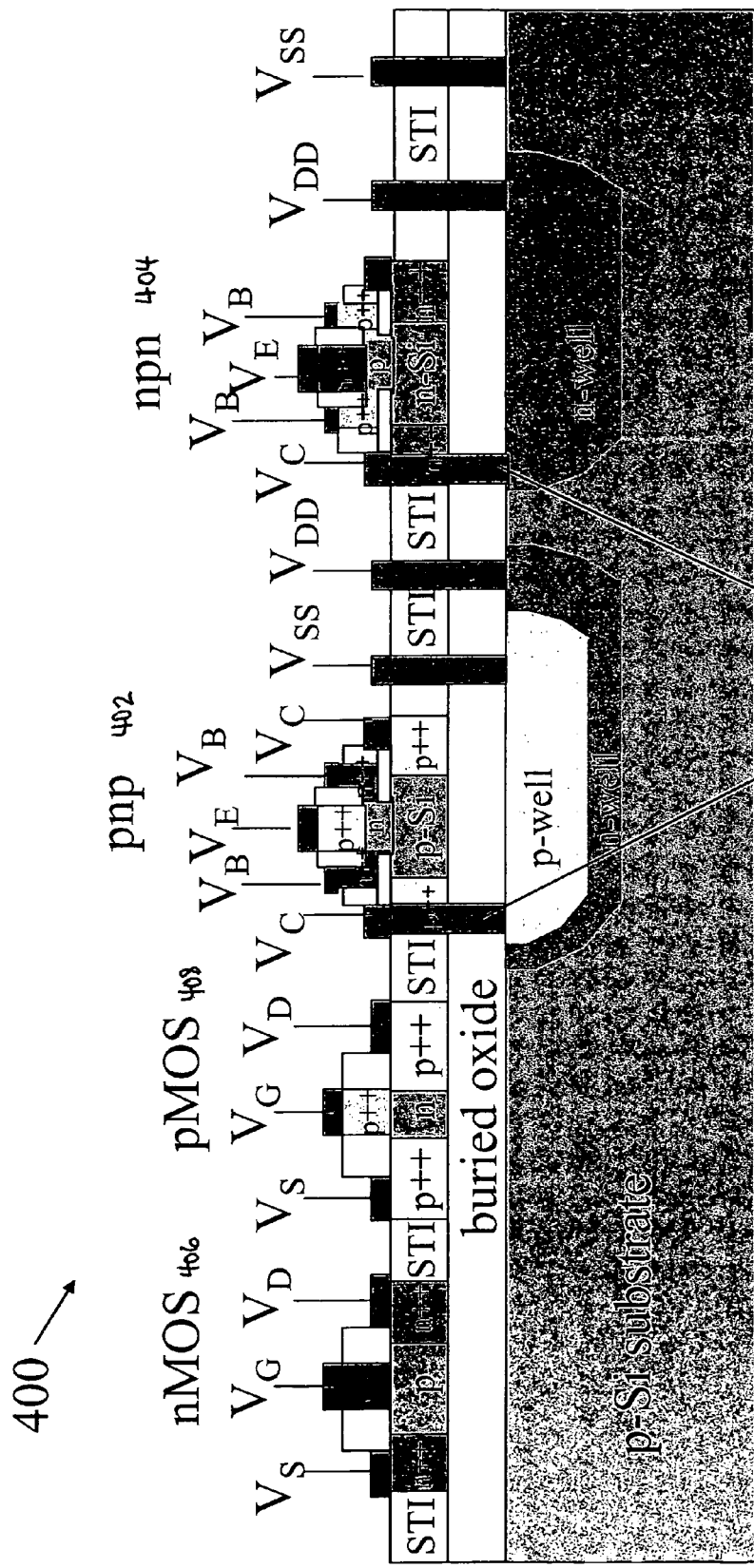
Fig. 4 Cross-sectional schematic of an integrated BiCMOS comprising complementary BJTs and complementary MOSFETs with well isolation and "heat drainage".

SOI BIPOLAR TRANSISTORS WITH REDUCED SELF HEATING

FIELD OF THE INVENTION

The invention disclosed broadly relates to the field of semi-conductor devices, and more particularly relates to bipolar transistors.

BACKGROUND OF THE INVENTION

Transistors, a basic component of analog and digital circuits, are commonly implemented using Complementary Metal Oxide Semiconductor (CMOS) technology. That technology increasingly uses SOI (Silicon on Insulator) substrate for device scaling. Both lateral and vertical bipolar transistors have been implemented with this technology. Furthermore, vertical bipolar transistors on thin SOI substrate with partially or fully depleted collector have shown high Early Voltage, high breakdown voltage, and reduced collector-base capacitance.

However, due to the poor thermal conductivity of buried oxide (BOX) layers, the self heating in lateral SOI BJTs and vertical SOI BJTs, especially on thin SOI substrates, can significantly degrade the performance of those devices. For example, the SiGe bipolar transistors on SOI substrate suffer from thermal runaway (for fixed $V_{be}$) or current collapse (for fixed I_b). The thinner the SOI is, and/or the thicker the BOX layer is, the worse these effects. Currently, trench technology is often used as device isolation, and the trenches tend to block the heat flow and make the self heating worse. In order to reduce the self-heating, better and or more heat conducting paths must be created within the device and/or among the devices on the same chip. Therefore, there is a need for an improved transistor structure that reduces self-heating.

SUMMARY OF THE INVENTION

Briefly, according to an embodiment of the invention, a bipolar transistor includes a collector located over a substrate; a base coupled to the collector; an emitter coupled to the base; and a heat conductive path directly connected to the substrate and to the collector. The heat conductive path is filled with a heat conductive material such as metal or polysilicon. In one embodiment the heat conductive path runs through the collector to extract heat from the collector and drain it to the substrate. In alternate embodiments, the transistor can be a vertical or a lateral device. According to another embodiment, an integrated circuit using biCMOS technology comprises pnp and npn bipolar transistors with heat conduction from collector to substrate and possibly p-channel and n-channel MOSFETS. According to yet another embodiment, a method for making a transistor in an integrated network comprises steps of etching the heat conducting path through the collector and to the substrate to provide a heat drain for the transistor comprising the collector.

BRIEF DESCRIPTION OF THE DRAWINGS

FIG. 4 shows the schematic of a complementary BiCMOS integrated circuit with heat drainage according to another embodiment of the invention.

DETAILED DESCRIPTION

We describe a structure that has reduced self-heating in SOI (Silicon on Insulator) bipolar junction transistors (BJTs). By creating a heat conducting path with better thermal-conducting materials such as metal or polysilicon, the self heating can be reduced significantly. We also discuss methods for reducing self-heating in SOI bipolar transistors.

We use the fact that in a bipolar transistor structure most power is generated in the collector. For example in a SiGe-base BJT, the total power generated at a collector is more than 1 mW. This power consumption heats up the transistor in which it occurs. One way to dissipate the heat generated by this power consumption is to use "heat drainage." The size of the heat drainage element does not have to be larger than it is for electrodes (for example, 90 nm minimum contact size for the state of art CMOS technologies). This is because metal has much larger thermal conductivity (10~20× better) than oxide. Therefore, adding this heat "drainage" element does necessarily not increase the chip size. Alternatively, doped polysilicon can be used for heat "drainage" as well.

Figure 1:
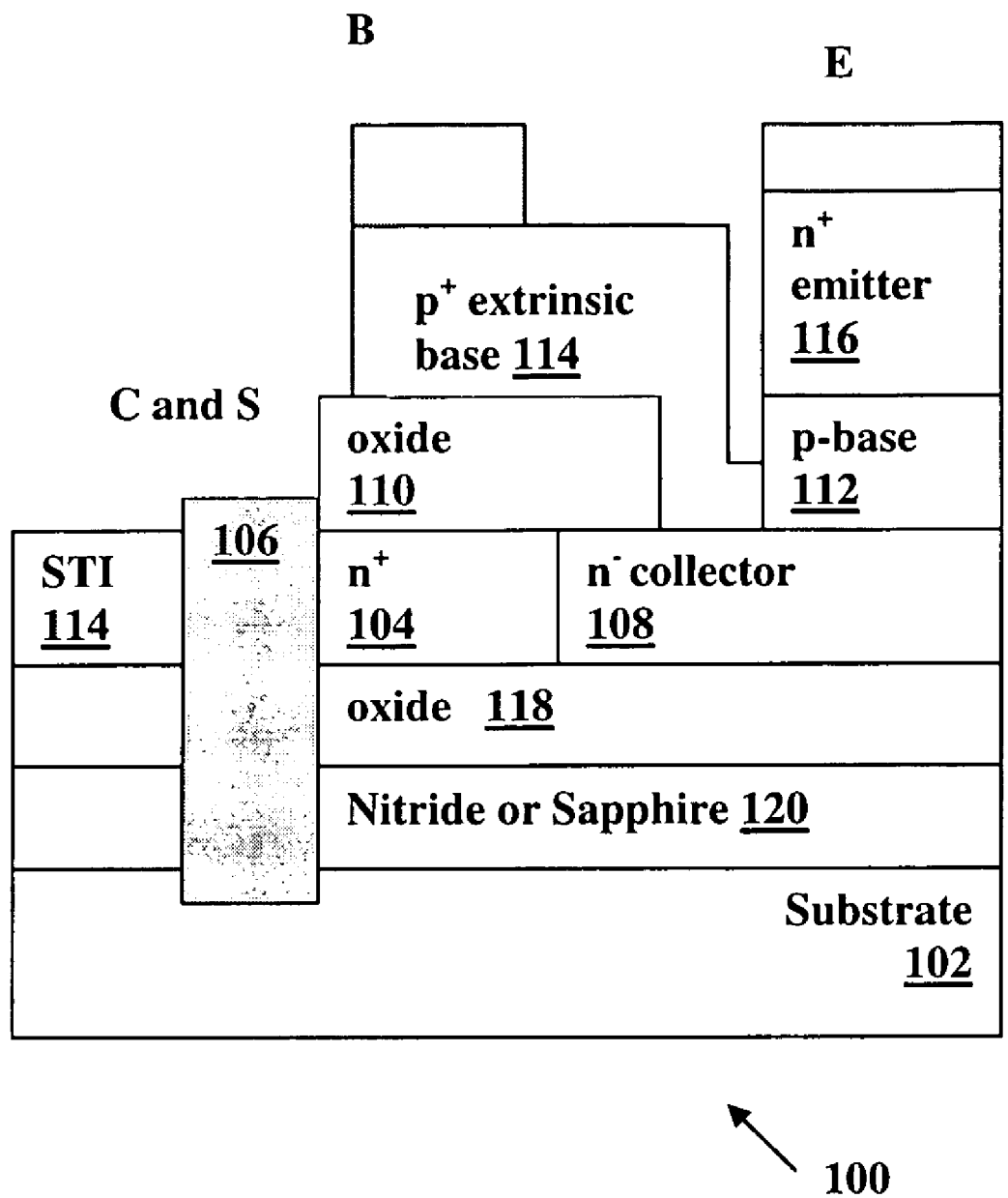
FIG. 1 shows the cross-sectional schematic of a vertical SOI BJT structure with reduced self-heating according to an embodiment of the invention.

Referring to FIG. 1, we show a vertical bipolar transistor 100 on a thin SOI substrate. The silicon substrate is layer 102. In this embodiment, the transistor 100 comprises an n-type collector 108 and a heavily doped reach-through region 104. The transistor 100 further comprises a p-type extrinsic base 114, a p-type base1 12, an n+-type emitter 116, and a oxide region 110. The heat conducting (e.g., metal) path 106 connects the substrate 102 to the n+reach-through 104. By using the heat path 106 in this configuration two advantages can be realized. First, the substrate 102 is now physically tied to the n+-collector 104, and an accumulation layer of majority carriers may be formed at the interface of collector 108 and the buried oxide (BOX) 118. Device performance can be improved (such as fT, fmax) due to the resulting reduced collector resistance. The effect is similar to applying an independent substrate bias to form the accumulation layer in the collector, as described in U.S. Pat. No. 6,812,533, "Bipolar transistor having a majority-carrier accumulation layer as sub-collector." Second, by connecting the collector 104 to the substrate 102 with metal through BOX 106, a new heat flow path is created and self heating can be reduced. Furthermore, a better thermal material layer 120 could be used to replace or combine with oxide, such as Sapphire or Nitride, or the like, as another embodiment. The transistor 100 further comprises a shallow trench isolation (STI) region 114.

The heat sink 106 can be added at no cost of device area by connecting the n+reach-though region 104 in the SOI collector directly to the substrate by metal or poly as depicted in FIG. 1.

Another embodiment for improving heat dissipation is to reduce the thickness of the BOX (e.g., BOX 118 of FIG. 1). This also allows low substrate bias operations to form the accumulation layer in the collector and further enhance device performance. According to this embodiment, a process to form a localized thin BOX (<10 nm) and a back electrode underneath the collector on a typical SOI wafer is used to reduce self-heating.

Figure 2:
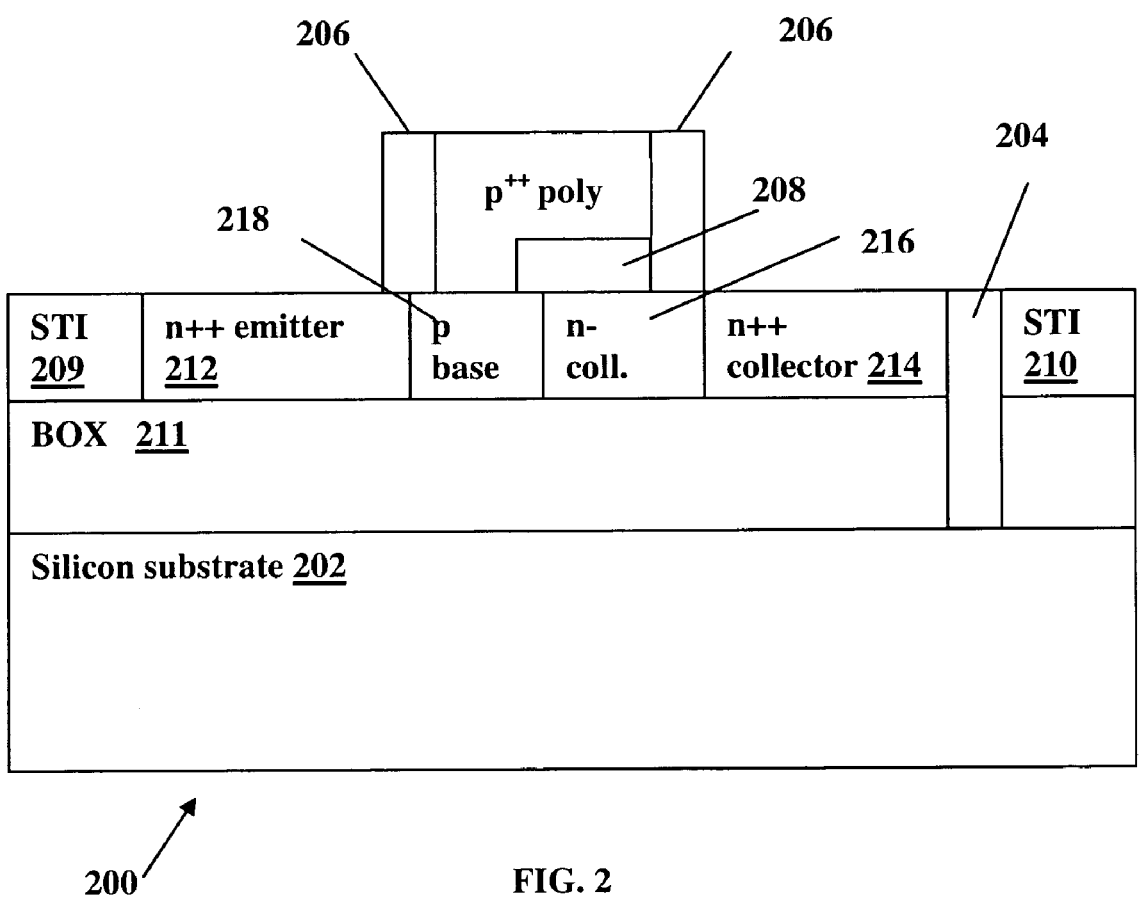
FIG. 2 shows the cross-sectional schematic of disclosed lateral SOI BJT structure with reduced self-heating according to another embodiment of the invention.

Referring to FIG. 2, we show a lateral BJT on SOI structure 200 according to a second embodiment of the invention. Lateral BJT 200 comprises a Silicon substrate 202, an n-type collector 216, an n++ collector 214, a p-type base 218, an n-type emitter 212 (heavily doped), and a metal or polysilicon connection 204 connecting the n++ collector 214 to the substrate 202. Oxide regions 206 and 208 provide isolation. The BJT 200 further comprises STI regions 209 and 210, and a BOX layer 211. The connection path 204 can comprise any material that conducts the heat generated by the collector to the substrate 202 or anywhere else having a lower temperature than the collector.

We now briefly discuss a simulated device having a single-finger, n++ poly emitter with width ($W_E$) of 100 nm, a uniform base doping profile ($N_B$) of 2e18 cm$^{-3}$ and a collector doping concentration (Nc) of 1e17 cm$^{-3}$. The base width is 80 nm. The SOI thickness ($T_{SOI}$) is 100 nm and the BOX thickness ($T_{BOX}$) is 200 nm for the SOI devices. The spacing between the emitter and the n++ extrinsic collector or reach-through region ($L_{col}$) is 100 nm. The length of the reach-through region which is also the spacing between the heat sink and the n-collector ($L_{spacing}$) is 350 nm and the size of the heat sink ($L_{sink}$) is 90 nm. The Ge content is zero in the Si-base devices and linearly graded from 0 to 20% in the SiGe-base BJTs. The heat conductivity of Si is used for the SiGe-base, which makes little difference in the heat dissipation in the device.

Figure 3A:
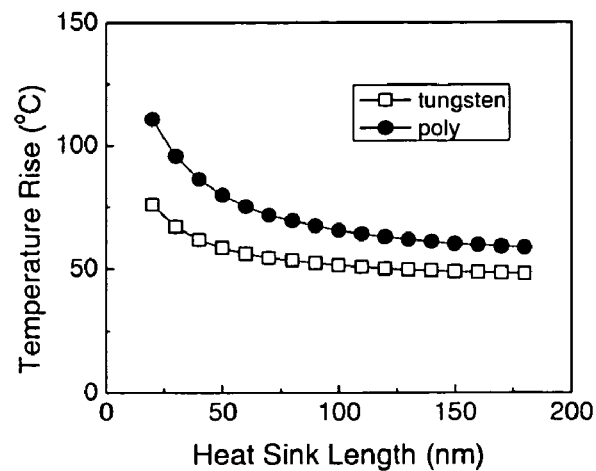
FIGS. 3A-3C show simulated geometry effects on the highest temperature in the device with the heat drainage.
Figure 3B:
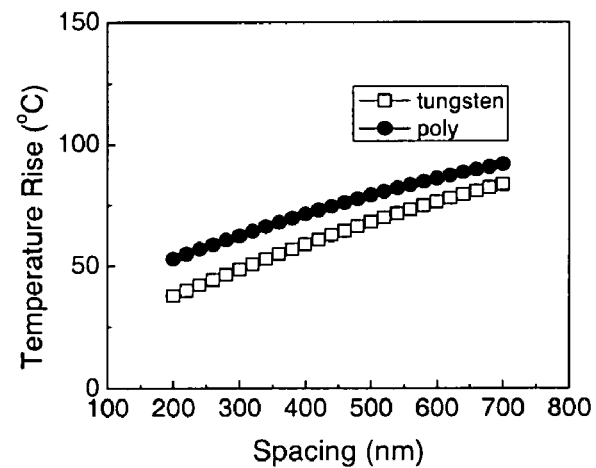
Figure 3C:
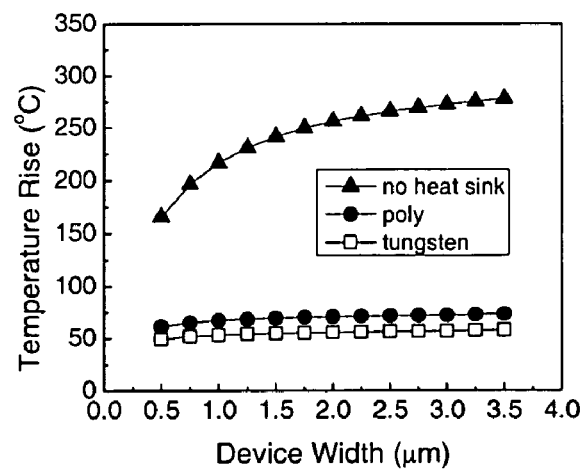

FIGS. 3A, B, and C show simulated geometry effects (the size of the heat drainage or contact width and the spacing between the drainage and the device) on the highest temperature in the device with the heat drainage. FIG. 3A shows peak ΔT versus $L_{drainage}$ at a fixed $L_{spacing}$. At $L_{drainage}$=90 nm (contact size of the state-of-art technology), ΔT is reduced significantly by 70-75%. ΔT starts to flatten out as $L_{drainage}$ is increased, which means most of benefit can be achieved by a relatively small heat drainage, which can be the size of the collector contact. FIG. 3(b) shows peak ΔT versus $L_{spacing}$ at a fixed $L_{drainage}$. At a small $L_{spacing}$, it is almost a linear dependence with a steeper slope (meaning more sensitive) for tungsten than poly. At a large $L_{spacing}$, the dependency gets weakened. FIG. 3(c) shows the peak ΔT versus device width (W) at $L_{drainage}$=90 nm and $L_{spacing}$= 350 nm. Without the heat drainage, ΔT rises rapidly at a small W, and starts to saturate at a large W. This is because the characteristics of heat dissipation change from 3D to 2D as device width increases, which results in a higher thermal resistance. On the other hand, with the heat drainage, ΔT is much lower and not sensitive to device width. This indicates that the heat drainage is very effective and can be used in large-width device for high current applications.

Referring to FIG. 4, we show a complementary BiCMOS on SOI integrated transistor structure 400 with vertical BJT and the heat drainage, according to a third embodiment. The substrate for the BJT devices is isolated by p-wells and n-wells. Structure 400 comprises complementary BJTs 402 (pnp) and 404 (npn) and complementary MOSFETs (metal-oxide field-effect transistors): NMOS 406 and pMOS 408, with well isolation and heat drainage. The heat draining is accomplished with heat conductive paths from the collector of the pnp BJT 402 to the p-well and from the collector of the npn BJT 404 to the n-well.

Figure 5:
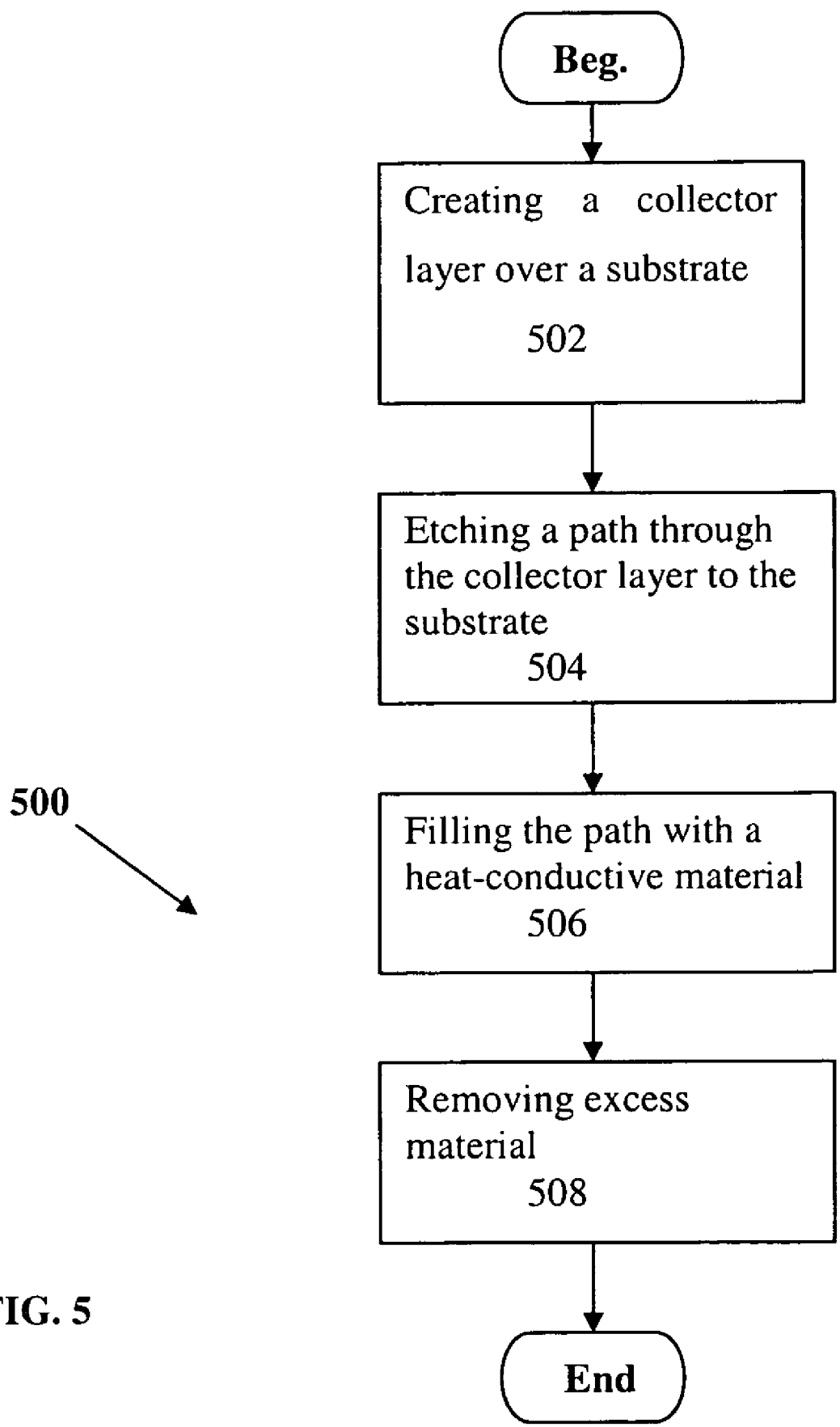
FIG. 5 is a flow chart of a method for constructing a bipolar transistor structure according to another embodiment of the invention.

Referring to FIG. 5, we show a method 500 for constructing a bipolar transistor comprising a collector, a base, and an emitter, all located over a substrate according to another embodiment of the invention. The method 500 comprises steps of: creating a collector layer over the substrate 502; etching a path through the collector layer to the substrate 504; filling the path with a heat-conductive material 506; and removing any excess heat-conductive material. The etching step 504 can be done with a reactive ion etch or a wet etch. Moreover, the etching can also be done through a buried oxide layer between the substrate and the collector. The step of filling the etched path can use metal or any other heat-conducting material.

Therefore, while there has been described what is presently considered to be the preferred embodiment, it will understood by those skilled in the art that other modifications can be made within the spirit of the invention.

We claim:

1. A bipolar transistor comprising:
   a substrate;
   a collector layer disposed over the substrate;
   a base coupled to the collector layer;
   an emitter coupled to the base;
   a heat conductive path connecting the substrate to the collector layer, wherein the heat conductive path runs through the collector layer and an insulator layer into the substrate; and
   a heavily doped reach-through region disposed between the collector layer and the heat conductive path.

2. The bipolar transistor of claim 1, further comprising an insulator layer and a thermal material layer disposed between the substrate and the collector.

3. The bipolar transistor of claim 2, wherein the insulator layer comprises one or more of oxide, nitride, and sapphire.

4. The bipolar transistor of claim 2 further comprising an oxide layer located over the collector layer.

5. The bipolar transistor of claim 1 wherein the collector layer comprises an n-type material.

6. The bipolar transistor of claim 1 wherein the collector layer comprises a p-type material.

7. The bipolar transistor of claim 2 wherein the insulator layer comprises an oxide material.

8. The bipolar transistor of claim 1 wherein the collector layer comprises a heavily-doped region in direct contact with the heat-conducting path.

9. The bipolar transistor of claim 1 wherein the heat-conductive path comprises a metal.

10. The bipolar transistor of claim 1 further comprising an insulator layer disposed between the substrate and the collector, wherein the insulator layer is thin and has a thickness in a range of 1 nm to 50 nm.

11. The bipolar transistor of claim 5 wherein the base comprises a p+extrinsic base and a p-base.

12. The bipolar transistor of claim 5 wherein the base comprises an n+extrinsic base and an n-base.

13. The bipolar transistor of claim 1 wherein the heat-conductive path comprises polysilicon.

14. The bipolar transistor of claim 1 wherein the transistor comprises a vertical structure wherein the base is located over the collector layer, the emitter is located over the base.

15. The bipolar transistor of claim 1 wherein the transistor comprises a lateral structure wherein the collector layer, the base and the emitter are located in a single layer above a buried oxide layer above the substrate.

16. An integrated circuit comprising:
   a pnp bipolar transistor comprising a p-well substrate;
   a p-type collector connected to the p-well substrate via a heat conductive path;

a heavily doped reach-through region coupled to the collector; and an npn bipolar transistor comprising a collector, an n-well substrate, and a heat conductive path from the collector to the n-well substrate.

17. The integrated circuit of claim 16 further comprising a biCMOS structure comprising an nMOS field effect transistor and a pMOS field effect transistor.

* * * * *